United States Patent
Kan

(10) Patent No.: US 10,405,430 B2
(45) Date of Patent: Sep. 3, 2019

(54) CERAMIC SUBSTRATE, ELECTRONIC COMPONENT, AND METHOD OF MANUFACTURING CERAMIC SUBSTRATE

(71) Applicant: Murata Manufacturing Co., Ltd., Kyoto (JP)

(72) Inventor: Tatsunori Kan, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/635,786

(22) Filed: Jun. 28, 2017

(65) Prior Publication Data

US 2017/0303398 A1    Oct. 19, 2017

Related U.S. Application Data

(63) Continuation of application No. PCT/JP2016/050098, filed on Jan. 5, 2016.

(30) Foreign Application Priority Data

Jan. 7, 2015  (JP) .................................. 2015-001647

(51) Int. Cl.
*H05K 7/00* (2006.01)
*H05K 1/18* (2006.01)
(Continued)

(52) U.S. Cl.
CPC .............. *H05K 1/18* (2013.01); *H01L 23/10* (2013.01); *H01L 23/13* (2013.01); *H01L 23/15* (2013.01);
(Continued)

(58) Field of Classification Search
CPC ......... H01L 2924/0002; H01L 2924/00; H01L 2224/16225; H01L 23/10; H01L 23/13;
(Continued)

(56) References Cited

U.S. PATENT DOCUMENTS 5,644,163 A * 7/1997 Tsuji ....................... H01L 23/13
257/705
2006/0261467 A1* 11/2006 Colgan ................... H01L 23/04
257/707
(Continued)

FOREIGN PATENT DOCUMENTS

JP    H06-237081 A    8/1994
JP    H09-221375 A    8/1997
(Continued)

OTHER PUBLICATIONS

International Search Report for PCT/JP2016/050098 dated Mar. 22, 2016.

(Continued)

*Primary Examiner* — Yuriy Semenenko
(74) *Attorney, Agent, or Firm* — Pearne & Gordon LLP

(57) ABSTRACT

Close-contact layers that are capable of improving the degree of contact between electrodes and a ceramic insulating layer can be formed at low cost by firing a glass paste. When the electrodes, the ceramic insulating layer, and the close-contact layers are fired at the same time, the glass paste is sintered last, and thus, formation of voids, defects, and the like in portions of the ceramic insulating layer, on which the electrodes are disposed, as a result of shrinkage of the electrodes and the ceramic insulating layer at the time of firing being hindered by stress generated due to the difference in the degree of shrinkage can be suppressed. Therefore, the structure of the ceramic insulating layers in the above portions can be elaborated by the close-contact layers.

2 Claims, 4 Drawing Sheets

(51) Int. Cl.
*H01L 23/13* (2006.01)
*H05K 3/46* (2006.01)
*H05K 1/03* (2006.01)
*H05K 3/12* (2006.01)
*H01L 23/10* (2006.01)
*H03H 9/10* (2006.01)
*H01L 23/15* (2006.01)

(52) U.S. Cl.
CPC ........ *H03H 9/1014* (2013.01); *H03H 9/1057* (2013.01); *H05K 1/0306* (2013.01); *H05K 3/1291* (2013.01); *H05K 3/46* (2013.01); *H01L 2224/16225* (2013.01); *H01L 2924/0002* (2013.01); *H01L 2924/16152* (2013.01); *H01L 2924/16195* (2013.01); *H05K 2201/10075* (2013.01)

(58) Field of Classification Search
CPC ........ H01L 2924/16152; H03H 9/1014; H03H 9/1057; H05K 1/0306; H05K 1/18; H05K 2201/10075; H05K 3/1291; H05K 3/46
See application file for complete search history.

(56) References Cited

U.S. PATENT DOCUMENTS

| | | | |
|---|---|---|---|
| 2010/0295421 A1 | 11/2010 | Takeuchi et al. | |
| 2014/0061893 A1* | 3/2014 | Saeidi | H01L 23/16 257/712 |
| 2014/0240905 A1* | 8/2014 | Takahashi | H05K 5/062 361/679.01 |
| 2015/0214128 A1* | 7/2015 | Lin | H01L 23/10 257/712 |
| 2015/0342072 A1* | 11/2015 | Nishina | B23K 35/30 277/630 |
| 2016/0118324 A1* | 4/2016 | Guo | H03H 9/1014 257/737 |

FOREIGN PATENT DOCUMENTS

| | | | |
|---|---|---|---|
| JP | H11-214582 A | | 8/1999 |
| JP | 2001-196485 A | | 7/2001 |
| JP | 2001196485 | * | 7/2001 |
| JP | 2005-210030 A | | 8/2005 |
| JP | 2009-194091 A | | 8/2009 |

OTHER PUBLICATIONS

Written Opinion of International Searching Authority for PCT/JP2016/050098 dated Mar. 22, 2016.

* cited by examiner

FIG. 5
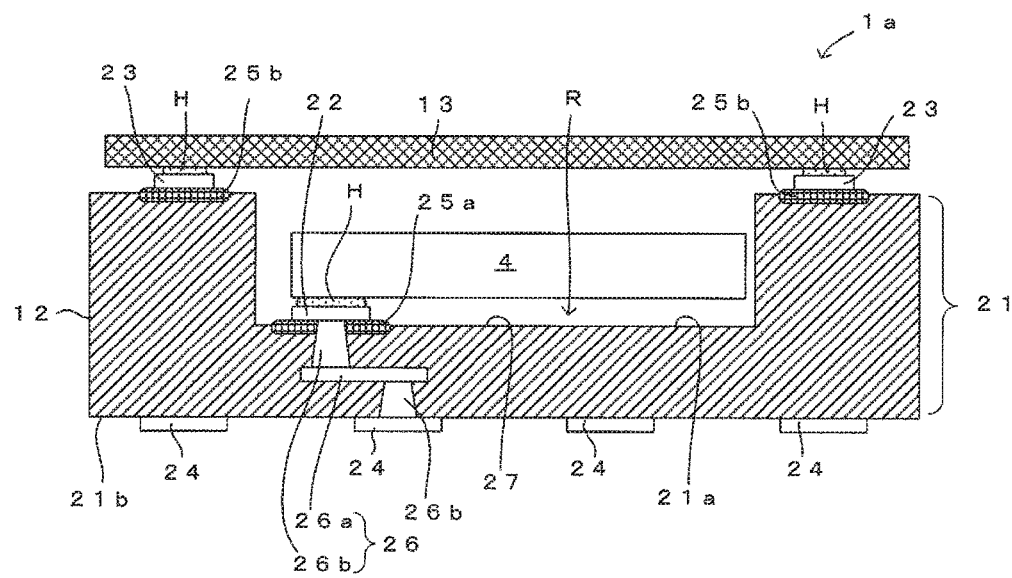
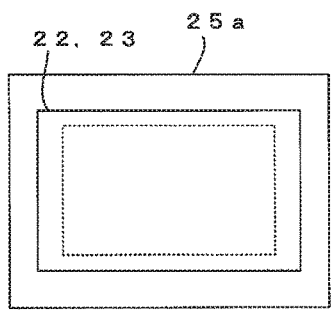
FIG. 6A
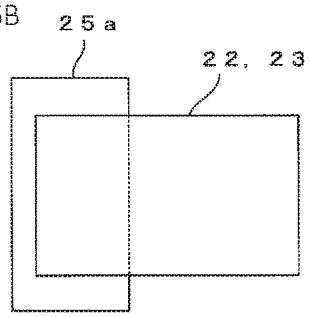
FIG. 6B
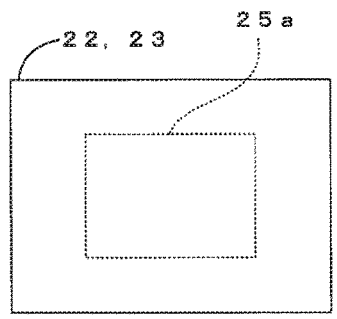
FIG. 6C

- PRIOR ART -

CERAMIC SUBSTRATE, ELECTRONIC COMPONENT, AND METHOD OF MANUFACTURING CERAMIC SUBSTRATE

This application is a continuation of International Application No. PCT/JP2016/050098 filed on Jan. 5, 2016 which claims priority from Japanese Patent Application No. JP 2015-001647 filed on Jan. 7, 2015. The contents of these applications are incorporated herein by reference in their entireties.

BACKGROUND OF THE DISCLOSURE

Field of the Disclosure

The present disclosure relates to a ceramic substrate that includes a ceramic insulating layer and an electrode formed on a main surface of the ceramic insulating layer, an electronic component that includes the substrate, and a method of manufacturing the substrate.

Description of the Related Art

In the related art, as illustrated in FIG. 7, there is provided an electronic component 500 that has a structure in which a device 504, such as a crystal oscillator, an elastic wave device, or a MEMS device, which includes a vibrating portion, is disposed in a cavity 503 of a ceramic substrate 502 that is sealed by a cover member 501 (see, for example, Patent Document 1). More specifically, a ring-shaped metallization layer 505 is formed on or in the top surface of a bank portion that is formed around the cavity 503, which is formed in a predetermined region of the ceramic substrate 502, such that the metallization layer 505 surrounds the cavity 503 when viewed in plan, and a ring-shaped plating layer 506 is formed on the metallization layer 505.

A ring-shaped metal film layer 507 that is made of a brazing metal or a brazing solder is formed on or in the bottom surface of the cover member 501 so as to be located at a position facing the plating layer 506. The plating layer 506 (the metallization layer 505) and the metal film layer 507 are joined to each other by seam welding in a state where the cover member 501 is disposed on the ceramic substrate 502 so as to close the cavity 503, so that the cavity 503 is sealed.

In addition, pad electrodes 508 are formed on or in the bottom of the cavity 503, and land electrodes 509 for external connection are formed on or in the bottom surface of the ceramic substrate 502. The pad electrodes 508 and the land electrodes 509 are electrically connected to each other by via conductors 510 formed in the ceramic substrate 502. In the cavity 503, the device 504 is electrically connected to the pad electrodes 508 with an electrically conductive bonding material 511 or the like.

Patent Document 1: Japanese Unexamined Patent Application Publication No. 2001-196485 ([0016] to [0022], FIG. 1, FIG. 2, Abstract, and the like)

BRIEF SUMMARY OF THE DISCLOSURE

In order to improve the degree of contact between the plating layer 506 and the ceramic substrate 502 and to improve a sealing property of the cavity 503 sealed by the cover member 501, after the ceramic substrate 502 has been formed, the metallization layer 505 is formed on or in the top surface of the ceramic substrate 502 so as to surround the cavity 503, and the plating layer 506 is formed on the metallization layer 505. However, in a structure of the related art, for example, as a result of a large stress being generated when the plating layer 506 and the metal film layer 507, which is made of a brazing metal or a brazing solder, are joined to each other, there is a possibility of structural defects, such as cracks and chips, occurring in a ceramic insulating layer (the ceramic substrate 502) on or in which the metallization layer 505 is formed. As a result, there is a possibility that the sealing property of the cavity 503 will deteriorate due to, for example, a gas, such as air, passing through the ceramic insulating layer.

The present disclosure has been made in view of the above problem, and it is an object of the present disclosure to provide a technology for reducing the probability of structural defects occurring in a ceramic insulating layer by forming a close-contact layer used for improving the degree of contact between an electrode and the ceramic insulating layer, or the electrode adhesiveness to the ceramic insulating layer, so that the structure of the ceramic insulating layer in a portion where the electrode is disposed can be elaborated.

To achieve the above-described object, a ceramic substrate according to the present disclosure includes a ceramic insulating layer, an electrode that is formed on a main surface of the ceramic insulating layer, and a close-contact layer that is formed by firing a glass paste and positioned between the electrode and the ceramic insulating layer.

A method of manufacturing a ceramic substrate according to the present disclosure includes a close-contact layer forming step in which a close-contact layer is formed by applying a glass paste to a main surface of a ceramic green sheet that is to become a ceramic insulating layer, an electrode forming step in which an electrode is formed by applying a conductive paste to the glass paste, and a firing step in which the ceramic green sheet, the close-contact layer, and the electrode are fired simultaneously.

According to the present disclosure configured as described above, since the close-contact layer, which is formed by firing the glass paste, is disposed between the electrode and the ceramic insulating layer, the degree of contact between the electrode and the ceramic insulating layer can be improved. In addition, when the electrode, the ceramic insulating layer, and the close-contact layer are fired at the same time, the time taken for the glass paste, which forms the close-contact layer, to be sintered is longer than the time taken for the electrode and the ceramic insulating layer to be sintered, and the stress generated due to a difference in the degree of shrinkage between the electrode and the ceramic insulating layer at the time of firing is reduced by being absorbed by the close-contact layer that has not yet been sintered. Therefore, the formation of voids, defects, and the like in a portion of the ceramic insulating layer, on which the electrode is disposed, as a result of shrinkage of the electrode and the ceramic insulating layer at the time of firing being hindered by the stress generated due to the difference in the degree of shrinkage can be suppressed, and thus, the structure of the ceramic insulating layer in the portion can be elaborated by the close-contact layer.

An area of the electrode when viewed in plan may be smaller than an area of the close-contact layer, and the electrode may be disposed in a region inside the close-contact layer when viewed in plan.

With such a configuration, the close-contact layer is brought into close contact with the entire bottom surface of the electrode, and thus, the degree of contact between the electrode and the ceramic insulating layer can be further effectively improved.

An electronic component according to the present disclosure includes the ceramic substrate according to a first or second aspect of the present disclosure, a cover member, and a device that includes a vibrating portion. The electrode is formed in a ring-like shape on the close-contact layer that is formed in a ring-like shape surrounding a predetermined region on the main surface of the ceramic insulating layer. The cover member is disposed on the electrode so as to cover the predetermined region and joined to the electrode with solder, and the device is disposed in a space that is formed between the cover member and the main surface of the ceramic insulating layer and that is defined by the electrode.

According to the present disclosure configured as described above, the structure of the ceramic insulating layer in the portion, on which the electrode is disposed, is elaborated as a result of the close-contact layer being formed in a ring-like shape between the electrode, which has a ring-like shape and to which the cover member is joined, and the ceramic insulating layer. Therefore, passage of a gas, such as air, through the portion of the ceramic insulating layer, on which the electrode is formed, can be suppressed, and thus, the airtightness (hermetic sealing performance) of the space, which is formed between the cover member and the main surface of the ceramic insulating layer and defined by the electrode, can be improved at low cost.

According to the present disclosure, a close-contact layer capable of improving the degree of contact between an electrode and a ceramic insulating layer can be formed at low cost by firing a glass paste. In addition, when the electrode, the ceramic insulating layer, and the close-contact layer are fired at the same time, the glass paste of the close-contact layer is sintered last, and thus, the formation of voids, defects, and the like in a portion of the ceramic insulating layer, on which the electrode is disposed, as a result of shrinkage of the electrode and the ceramic insulating layer at the time of firing being hindered by stress generated due to the difference in the degree of shrinkage can be suppressed. Therefore, the structure of the ceramic insulating layer in the above portion can be elaborated by the close-contact layer.

BRIEF DESCRIPTION OF THE SEVERAL VIEWS OF THE DRAWINGS

FIG. 5 is a cross-sectional view of an electronic component according to a second embodiment of the present disclosure.

FIGS. 6A to 6C are diagrams each illustrating a modification of the positional relationship between electrodes and a close-contact layer.

DETAILED DESCRIPTION OF THE DISCLOSURE

First Embodiment

Figure 2:
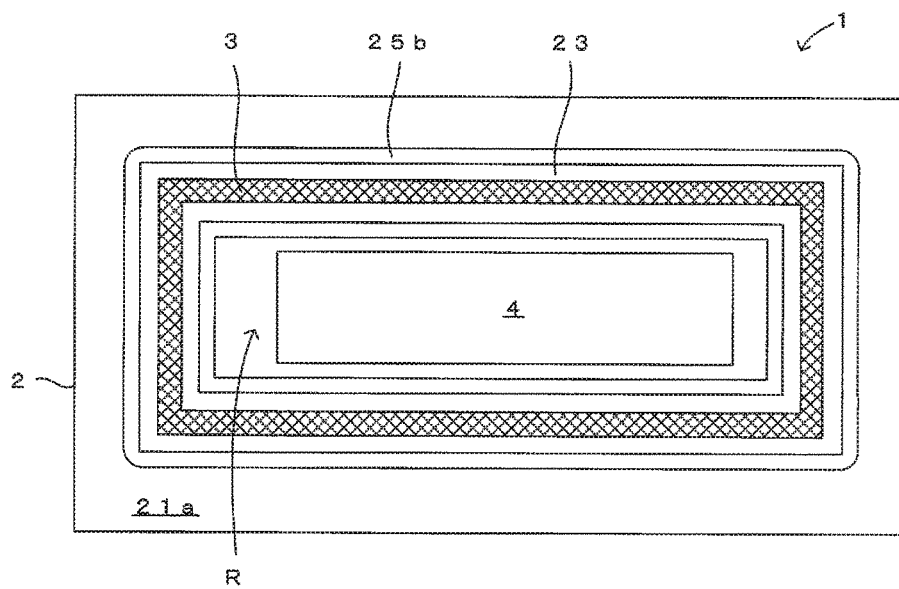
FIG. 2 is a sectional view taken along line A-A of FIG. 1.
Figure 3:
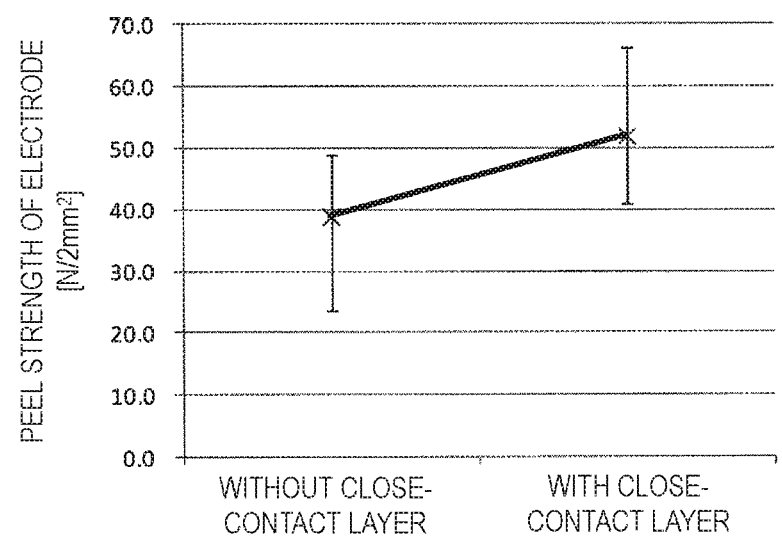
FIG. 3 is a graph illustrating the peel strength of an electrode.

An electronic component according to a first embodiment of the present disclosure will be described with reference to FIG. 1 to FIG. 3. Note that solder H is not illustrated in FIG. 2.

Figure 1:
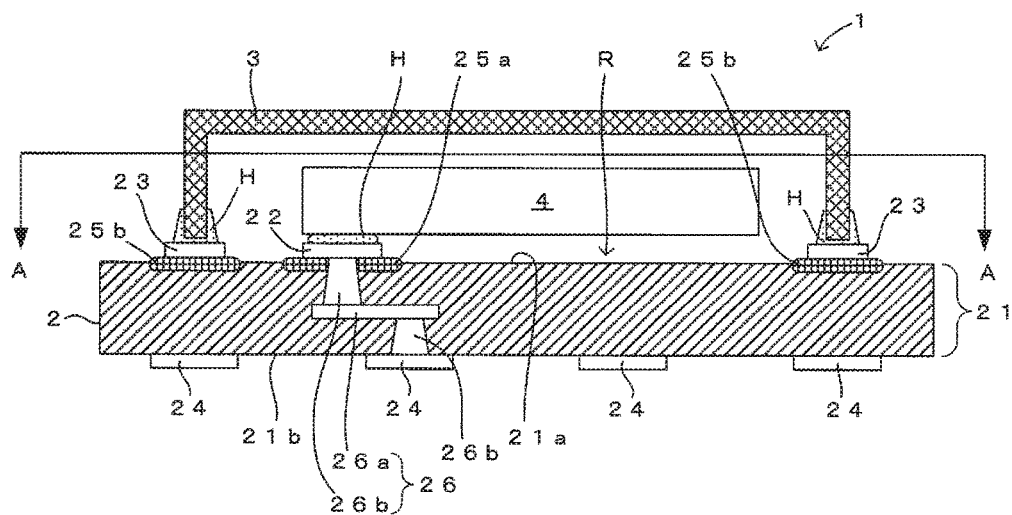
FIG. 1 is a cross-sectional view of an electronic component according to a first embodiment of the present disclosure.

As illustrated in FIG. 1, an electronic component 1 includes a ceramic substrate 2, a cover member 3, and a device 4.

The ceramic substrate 2 includes a ceramic insulating layer 21 that is formed by integrally firing a plurality of ceramic green sheets stacked on top of one another, electrodes 22 and 23 that are formed on a first main surface 21a of the ceramic substrate 2 (the ceramic insulating layer 21) and used for mounting various components, electrodes 24 for external connection that are formed on or in a second main surface 21b, and close-contact layers 25a and 25b that are formed by firing a glass paste and positioned between the electrodes 22 and 23 and the ceramic insulating layer 21. An internal wiring electrode 26 that includes an in-plane conductor 26a and interlayer-connection via conductors 26b is formed in the ceramic insulating layer 21.

The electrode 22 is formed in a predetermined region R on the first main surface 21a of the ceramic insulating layer 21 in which the device 4 is disposed, and the device 4 is mounted on the electrode 22 by using a joining material such as the solder H. In addition, the electrode 22 is connected to a corresponding one of the electrodes 24, which are formed on or in the second main surface 21b of the ceramic insulating layer 21, by the internal wiring electrode 26. When viewed in plan, the area of the close-contact layer 25a, which is positioned between the electrode 22 and the ceramic insulating layer 21, (excluding a region in which one of the via conductors 26b is formed), is larger than that of the electrode 22. The electrode 22 is disposed in a region inside the close-contact layer 25a when viewed in plan, and the close-contact layer 25a projects outward from the electrode 22 when viewed in plan. In other words, the close-contact layer 25a is disposed in a region inside the external shape of the electrode 22.

The electrode 23 is formed in a ring-like shape on the close-contact layer 25b that is formed in a ring-like shape surrounding the predetermined region R on the first main surface 21a of the ceramic insulating layer 21, in which the device 4 is disposed. When viewed in plan, the area of the close-contact layer 25b, which is positioned between the electrode 23 and the ceramic insulating layer 21, is larger than that of the electrode 23. The electrode 23 is disposed in a region inside the close-contact layer 25b, and the close-contact layer 25b projects outward from the electrode 23 when viewed in plan.

The cover member 3 is formed of, for example, a cap member made of a metal, such as Kovar, and a ring-shaped end surface thereof on the side on which an opening is formed is positioned on the electrode 23 such that the cover member 3 covers the device 4 disposed in the predetermined region R. The circumferential edge portion of the opening is joined to the electrode 23 with the solder H composed of, for example, SnAgCu or AuSn. The device 4 is disposed in a space that is formed between the inner surface of the cover member 3 and the first main surface 21a of the ceramic insulating layer 21 and defined by the electrode 23.

The device 4 is a device, such as a crystal oscillator, an elastic wave device, or a MEMS device, which includes a vibrating portion, and as illustrated in FIG. 1, the device 4 that is formed of, for example, a crystal oscillator is disposed in a hermetically-sealed space.

(Method of Manufacturing Ceramic Substrate 2)

An example of a method of manufacturing the ceramic substrate 2 will now be described.

First, the ceramic green sheets to be used for forming the ceramic insulating layer 21 are prepared. Each of the ceramic green sheets is formed by forming a slurry, which is obtained by mixing a mixed powder including, for example, alumina and glass together with an organic binder, a solvent, and the like, into a sheet by using a molding machine. Each of the ceramic green sheets is formed so as to be capable of undergoing so-called low-temperature firing performed at about 1,000 degrees, which is a low temperature. Then, via holes are formed in the ceramic green sheets, each of which has been cut in a predetermined shape, by laser processing or the like. The via holes are filled with a conductive paste including, for example, Ag or Cu, or via-filling plating is performed on the via holes such that the interlayer-connection via conductors 26b are formed, and various in-plane conductors 26a are formed by performing printing with the conductive paste. As a result, a plurality of insulating layers are formed.

Regarding one of the ceramic green sheets included in the ceramic insulating layer 21, the ceramic green sheet forming the uppermost insulating layer, first, the close-contact layers 25a and 25b are formed by applying the glass paste to predetermined positions on the first main surface 21a of the ceramic green sheet (close-contact layer forming process). Next, the via conductors 26b are formed by filling, with the conductive paste, the via holes formed by laser processing or the like. Then, the electrodes 22 and 23 are formed by applying the conductive paste to the glass paste (electrode forming process).

Subsequently, the ceramic green sheets are stacked on top of one another and then fixed to one another by applying pressure, so that a ceramic multilayer body is formed. The ceramic green sheets, the close-contact layers 25a and 25b, and the electrodes 22, 23, 24, and 26 undergo the so-called low-temperature firing performed at about 1,000 degrees, which is a low temperature, at the same time while being applied with pressure in a stacking direction, so that the ceramic substrate 2 is formed (firing process). Note that the ceramic substrate 2 may be formed of a single ceramic insulating layer.

(Peel Strength of Electrode)

The peel strength of the electrodes 22 and 23 will now be described with reference to FIG. 3. Note that, in FIG. 3, the vertical axis denotes the peel strength of an electrode, and the plot on the left side and the plot on the right side respectively represent the peel strength in the case where a close-contact layer is not provided and the peel strength in the case where a close-contact layer is provided.

The following measurement was conducted in order to determine the relationship between the existence of the close-contact layers 25a and 25b and the peel strength of the electrodes 22 and 23. A jig was joined, with solder, to the electrode formed on a ceramic insulating layer and having a square shape whose dimensions are 2 mm×2 mm, and the peel strength of the electrode in the case where the close-contact layer was formed and the peel strength of the electrode in the case where the close-contact layer was not formed were measured by pulling the jig. As a result, as illustrated in FIG. 3, in the case where the close-contact layer was formed between the electrode and the ceramic insulating layer, the peel strength of the electrode is improved and is about 20% higher than that in the case where the close-contact layer was not formed between the electrode and the ceramic insulating layer.

As described above, in the present embodiment, various components, such as the device 4 and the cover member 3, are joined to the electrodes 22 and 23 with a joining material, such as the solder H, and thus, thermal history occurs when, for example, the solder H is caused to melt. However, since the close-contact layers 25a and 25b, which are formed by firing the glass paste, are disposed between the electrodes 22 and 23 and the ceramic insulating layer 21, the degree of contact between the electrodes 22 and 23 and the ceramic insulating layer 21 can be improved. Therefore, in a process in which the thermal history occurs in the electrodes 22 and 23, the electrodes 22 and 23 can be prevented from separating from the ceramic insulating layer 21 and from breaking due to, for example, the stress generated when the solder H solidifies and shrinks. In addition, since the close-contact layers 25a and 25b can be formed by being simultaneously fired with the electrodes 22, 23, 24, and 26 and the ceramic insulating layer 21, unlike the related art, a process of forming a metallization layer and a process of forming a plating layer are not necessary, and the close-contact layers 25a and 25b can be formed at low cost.

When the electrodes 22 and 23, the ceramic insulating layer 21, and the close-contact layers 25a and 25b are fired at the same time, the time taken for the glass paste, which forms the close-contact layers 25a and 25b, to be sintered is longer than the time taken for the electrodes 22 and 23 and the ceramic insulating layer 21 to be sintered, and the close-contact layers 25a and 25b are sintered last. Thus, the stress generated due to a difference in the degree of shrinkage between the electrodes 22 and 23 and the ceramic insulating layer 21 at the time of firing is reduced by being absorbed by the close-contact layers 25a and 25b that have not yet been sintered. Consequently, the formation of voids, defects, and the like in the portions of the ceramic insulating layer 21, on which the electrodes 22 and 23 are disposed, as a result of shrinkage of the electrodes 22 and 23 and the ceramic insulating layer 21 at the time of firing being hindered by the stress generated due to the difference in the degree of shrinkage can be suppressed, and thus, the structure of the ceramic insulating layer 21 in the portions can be elaborated by the close-contact layers 25a and 25b. Therefore, the passage of a gas, such as air, through the ceramic insulating layer 21, especially through the portion on which the electrode 23 is formed, can be suppressed, and thus, the airtightness (hermetic sealing performance) of the space, which is formed between the inner surface of the cover member 3 and the first main surface 21a of the ceramic insulating layer 21 and defined by the electrode 23, can be improved at low cost.

Figure 4:
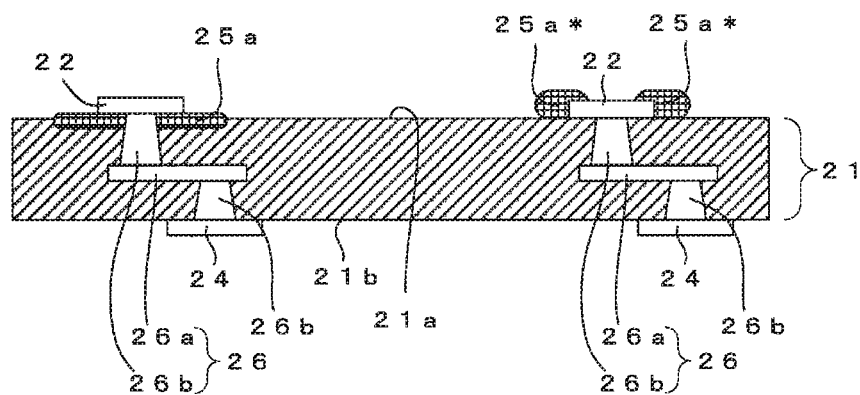
FIG. 4 is a diagram illustrating a difference from a framing structure of the related art.
Figure 7:
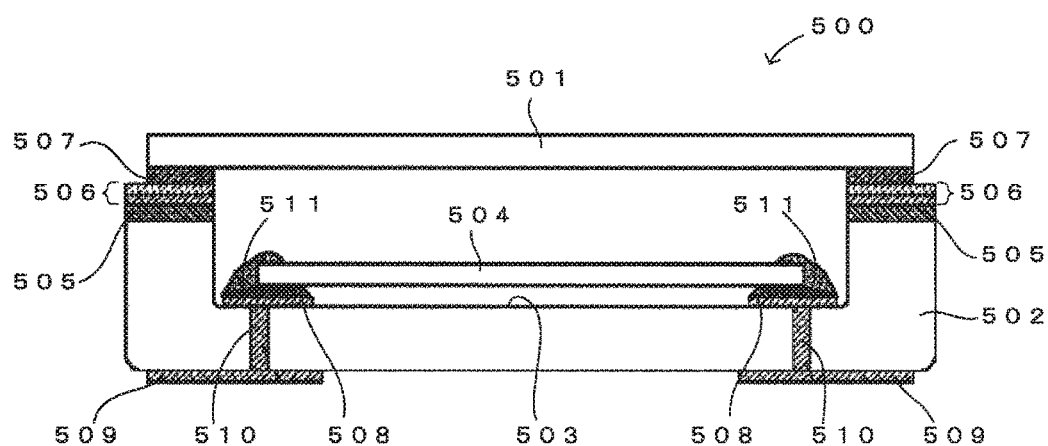
FIG. 7 is a diagram illustrating an electronic component that includes a ceramic substrate of the related art.

In addition, the close-contact layers 25a and 25b are disposed so as to be respectively brought into close contact with the entire bottom surface of the electrode 22 (excluding a region in which one of the via conductors 26b is formed) and the entire bottom surface of the electrode 23, and thus, the degree of contact between the electrodes 22 and 23 and the ceramic insulating layer 21 can be effectively improved. The electrodes 22 and 23 may be arranged in any manner on the close-contact layers 25a and 25b, respectively. Thus, in the above-described configuration, as in the case of the close-contact layer 25a that is in close contact with the bottom surface of the electrode 22 disposed on the left side in FIG. 4, the tolerance for errors in the positions of the electrodes 22 and 23 and the close-contact layers 25a and 25b on the first main surface 21a in a surface direction and the degree of freedom in design are larger than those in the case of a configuration in which the end edge portions of the electrodes 22 and 23 are framed by, for example, a glass paste, such as a framing structure 25a\* in which the end edge portion of the electrode 22 disposed on the right side in FIG. 4 is covered. Therefore, the above-described configuration is effective in the case of forming the electrodes 22 and 23 each having a smaller size so as to decrease the distance between the electrodes 22 and 23 and can contribute to a reduction in the size of the electronic component 1.

Second Embodiment

An electronic component according to a second embodiment of the present disclosure will now be described with reference to FIG. 5. Note that, in the following description, the differences between the second embodiment and the above-described first embodiment will be mainly described, and components similar to those in the above-described first embodiment are denoted by the same reference numerals, and repeated descriptions thereof will be omitted.

The differences between an electronic component 1a illustrated in FIG. 5 and the electronic component 1 illustrated in FIG. 1 are that a cavity 27 is formed in the predetermined region R of a ceramic substrate 12 (ceramic insulating layer 21) and that a cover member 13, which is made of a metal, such as Kovar, and which has a flat plate-like shape, is disposed on the electrode 23 so as to close the cavity 27 and is joined to the electrode 23 with the solder H. The device 4 is disposed in a space within the cavity 27 sealed by the cover member 13.

Also in such a configuration, advantageous effects similar to those of the above-described first embodiment can be obtained.

Note that the present disclosure is not limited to the above-described embodiments, and various changes other than those described above can also be made within the scope of the present disclosure. In addition, the configurations according to the above-described embodiments may be combined with each other in any manner. For example, in the above-described embodiments, although the close-contact layers 25a and 25b are formed by firing the glass paste, a ceramic component, such as alumina, may be included in the glass paste. In other words, the glass paste forming the close-contact layers 25a and 25b may be a ceramic paste having a glass content higher than that of each of the ceramic green sheets, which form the ceramic insulating layer 21.

A close-contact layer may be formed by applying the glass paste to the entire first main surface 21a of the ceramic insulating layer 21. In addition, the close-contact layer 25a may be formed so as to have the same size as that of each of the electrodes 22 and 23 and to be superposed with the electrodes 22 and 23 when viewed in plan. Furthermore, the close-contact layer 25a may be disposed on or in at least portions of the bottom surfaces of the electrodes 22 and 23. For example, the close-contact layer 25a, which is formed in a rectangular frame-like shape, and the electrodes 22 and 23, each of which has a rectangular shape, may be arranged such that the close-contact layer 25a and the peripheral edge portions of the electrodes 22 and 23 are superposed with one another when viewed in plan as illustrated in FIG. 6A. Alternatively, the close-contact layer 25a and the electrodes 22 and 23 may be arranged such that portions of the electrodes 22 and 23 are superposed with the close-contact layer 25a as illustrated in FIG. 6B. Alternatively, the close-contact layer 25a and the electrodes 22 and 23 may be arranged such that the close-contact layer 25a is disposed in a region inside the electrodes 22 and 23 as illustrated in FIG. 6C.

In the electronic components 1 and 1a, other components besides those described above may be placed in the predetermined region R of the first main surface 21a of the ceramic insulating layer 21, or other components may be placed in a region different from the predetermined region R of the first main surface 21a of the ceramic insulating layer 21.

The present disclosure can be widely applied to a ceramic substrate that includes a ceramic insulating layer and an electrode formed on a main surface of the ceramic insulating layer, an electronic component that includes the substrate, and a method of manufacturing the substrate.

1, 1a electronic component
2, 12 ceramic substrate
21 ceramic insulating layer
21a first main surface
22, 23 electrode
25a, 25b close-contact layer
3, 13 cover member
4 device
H solder
R predetermined region

The invention claimed is:

1. An electronic component comprising:
   a ceramic insulating layer;
   an electrode provided on a main surface of the ceramic insulating layer;
   a cover member;
   a device including a vibrating portion; and
   a close-contact layer comprising a fired glass paste and positioned between the electrode and the ceramic insulating layer,
   wherein the electrode has a ring-like shape on the close-contact layer having a ring-like shape surrounding a predetermined region on the main surface of the ceramic insulating layer,
   wherein the cover member is disposed on the electrode so as to cover the predetermined region and joined to the electrode with solder,
   wherein the device is disposed in a space between the cover member and the main surface of the ceramic insulating layer and defined by the electrode,
   wherein a glass content of the close contact layer is higher than a glass content of the ceramic insulating layer.

2. The electronic component according to claim 1,
   wherein an area of the electrode when viewed in plan is smaller than an area of the close-contact layer, and
   wherein the electrode is disposed in a region inside the close-contact layer when viewed in plan.

* * * * *